(12) United States Patent
Mitsui

(10) Patent No.: US 8,976,532 B2
(45) Date of Patent: Mar. 10, 2015

(54) SLIDE UNIT FOR ELECTRONIC APPARATUS

(75) Inventor: Yasuhiro Mitsui, Chiba (JP)

(73) Assignee: Mitsubishi Steel Mfg. Co., Ltd., Tokyo (JP)

( * ) Notice: Subject to any disclaimer, the term of this patent is extended or adjusted under 35 U.S.C. 154(b) by 61 days.

(21) Appl. No.: 13/807,062

(22) PCT Filed: Jul. 11, 2011

(86) PCT No.: PCT/JP2011/065780
§ 371 (c)(1),
(2), (4) Date: Dec. 27, 2012

(87) PCT Pub. No.: WO2012/008403
PCT Pub. Date: Jan. 19, 2012

(65) Prior Publication Data
US 2013/0094129 A1 Apr. 18, 2013

(30) Foreign Application Priority Data
Jul. 12, 2010 (JP) .................................. 2010-157780

(51) Int. Cl.
*H05K 7/16* (2006.01)
*H05K 5/00* (2006.01)
(Continued)

(52) U.S. Cl.
CPC ............... *H05K 7/18* (2013.01); *H04M 1/0237* (2013.01)
USPC .......................... 361/727; 361/756; 455/575.4

(58) Field of Classification Search
CPC ............ H04M 1/0237; H04M 1/0235; H04M 1/0245; H04M 1/0247; G06F 1/184; G06F 1/185; G06F 1/186; G06F 1/181; G06F 1/183; G06F 1/187; G06F 1/1624; G11B 33/128; H05K 7/1425; H05K 7/1409; H05K 7/1418; H05K 7/1429

See application file for complete search history.

(56) References Cited

U.S. PATENT DOCUMENTS 7,574,243 B2 * 8/2009 Lee ............................. 455/575.4
7,646,866 B2 * 1/2010 Lin et al. ................... 379/433.12
(Continued)

FOREIGN PATENT DOCUMENTS

JP 2008-113067 5/2008
JP 2008-305970 12/2008
(Continued)

OTHER PUBLICATIONS

International Search Report mailed on Aug. 30, 2011.

*Primary Examiner* — Hoa C Nguyen
*Assistant Examiner* — Xanthia C Cunningham
(74) *Attorney, Agent, or Firm* — IPUSA, PLLC

(57) ABSTRACT

The present invention relates to a slide unit for an electronic apparatus, including a base having a flat surface extending in front and rear directions and having a left end part and a right end part along the front and rear directions on both sides along a width direction perpendicular to top and bottom directions of the flat surface, a pair of left and right intermediate plates attached to the left end part and the right end part, respectively, to be slideable in the front and rear directions via a first slider mechanism, and a slide plate attached to the pair of left and right intermediate plates to be slideable in the front and rear directions via a second slider mechanism, wherein at least one of the first slider mechanism and the second slider mechanism includes a slide member extending in the front and rear directions, and a sliding member slideably supporting the slide member from both sides of the top and bottom directions and from both sides of the width direction.

14 Claims, 19 Drawing Sheets

(51) Int. Cl.
*H04M 1/00* (2006.01)
*H05K 7/18* (2006.01)
*H04M 1/02* (2006.01)

(56) References Cited

U.S. PATENT DOCUMENTS

| | | | |
|---|---|---|---|
| 7,752,710 B2* | 7/2010 | Lin | 16/334 |
| 8,284,544 B2* | 10/2012 | Griffin et al. | 361/679.01 |
| 8,478,370 B2* | 7/2013 | Laaksonen | 455/575.4 |
| 2003/0119544 A1* | 6/2003 | Gventer | 455/550 |
| 2005/0054398 A1* | 3/2005 | Kim | 455/575.4 |
| 2005/0113154 A1* | 5/2005 | Park et al. | 455/575.4 |
| 2006/0030381 A1* | 2/2006 | Byun et al. | 455/575.4 |
| 2008/0058039 A1* | 3/2008 | Lee et al. | 455/575.4 |
| 2008/0253555 A1* | 10/2008 | Lin et al. | 379/433.12 |
| 2009/0029741 A1* | 1/2009 | Satou et al. | 455/566 |
| 2009/0135555 A1* | 5/2009 | Komine et al. | 361/679.26 |
| 2009/0149230 A1* | 6/2009 | Ruan | 455/575.4 |
| 2010/0323770 A1* | 12/2010 | Chuang et al. | 455/575.4 |
| 2011/0287819 A1* | 11/2011 | Lee et al. | 455/575.4 |

FOREIGN PATENT DOCUMENTS

| | | |
|---|---|---|
| JP | 2009-177343 | 8/2009 |
| JP | 2010-154434 | 7/2010 |
| JP | 2010-154439 | 7/2010 |
| WO | WO 2010/073963 | 7/2010 |
| WO | WO 2010/074174 | 7/2010 |

* cited by examiner

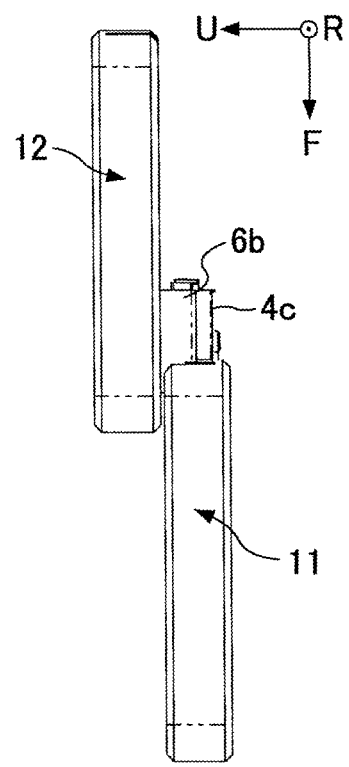

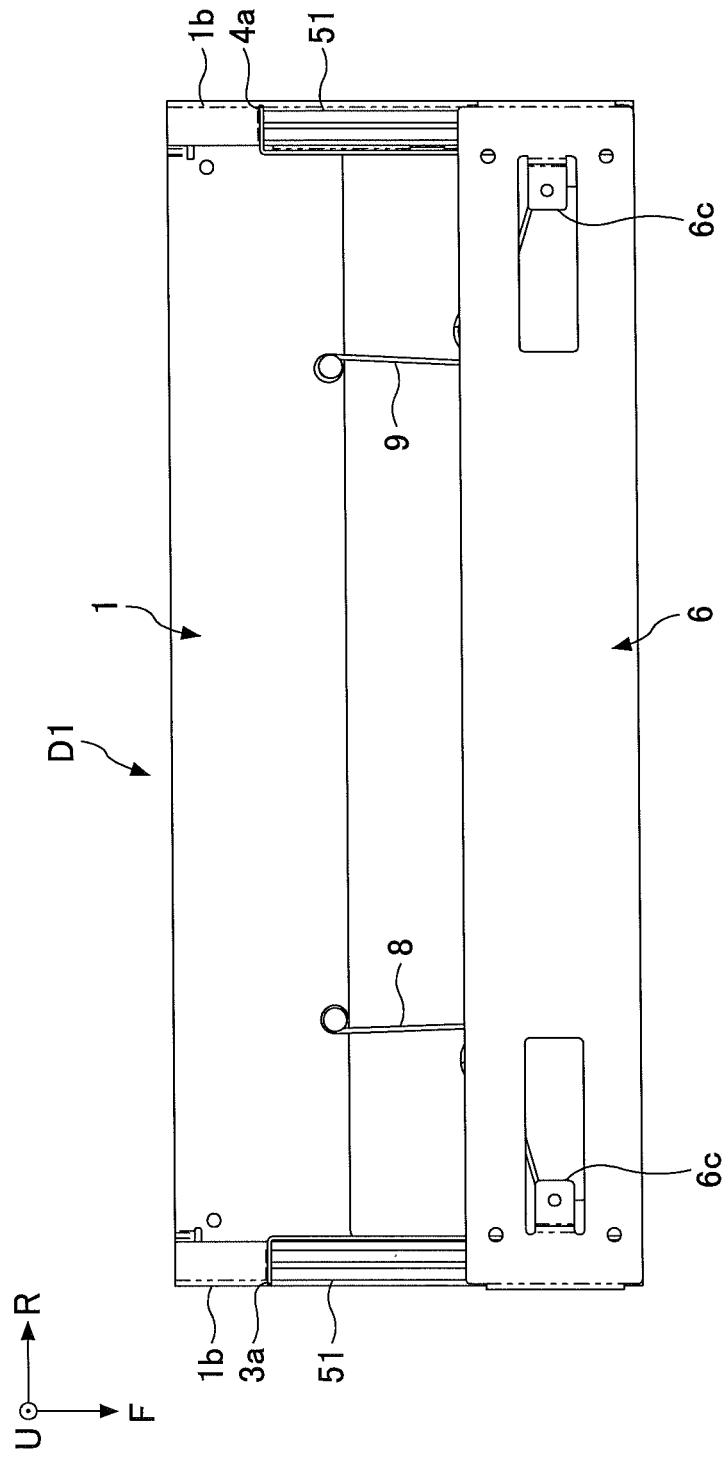

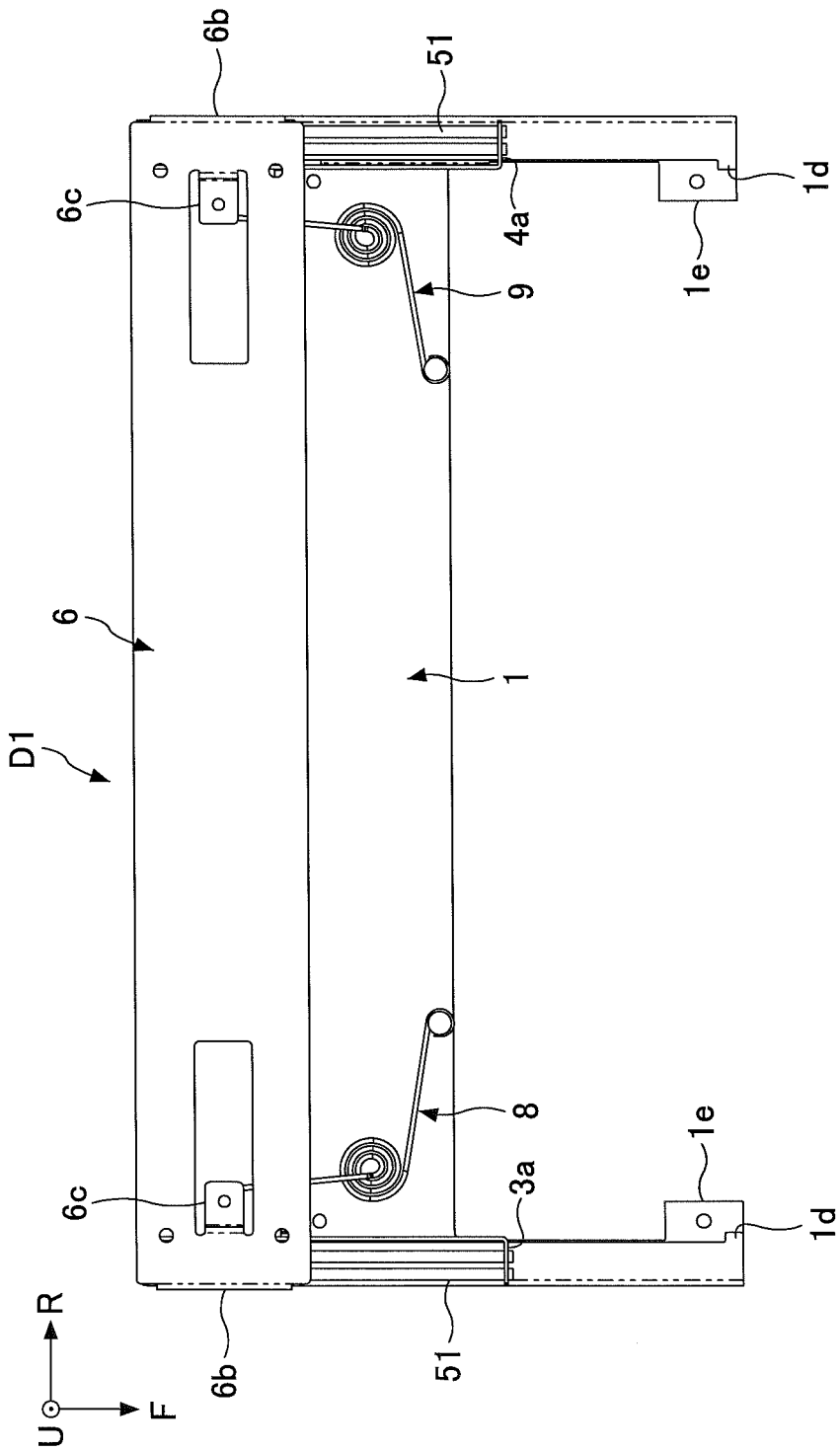

SLIDE UNIT FOR ELECTRONIC APPARATUS

TECHNICAL FIELD

The present invention relates to slide units for electronic apparatuses, that include a main part and a sub part, and make the sub part slideable with respect to the main part, and more particularly to a slide unit suitably applicable to apparatuses such as mobile phones, mobile terminals, and the like.

BACKGROUND ART

An electronic apparatus that forms the mobile phone or the mobile terminal may include a main part, and a sub part that is slideable with respect to the main part. The main part may include a ten-key, a microphone, or the like, and the sub part may include a liquid crystal display, speaker, or the like.

In the case of the electronic apparatus forming the mobile phone, a sliding operation may be carried out by a user to slide the sub part that is attached to the main part via a slide unit for the electronic apparatus, in order to select an open state in which the speaker is positioned at the user's ear and the microphone is positioned near the user's mouth or jaw. Similarly, in the case of the mobile terminal, a closed state in which the ten-key is covered by the sub part may be selected when the mobile terminal is not in use, and an open state in which the ten-key or the liquid crystal display is exposed to the front may be selected when using the mobile terminal.

Compared to a hinge mechanism, the slide unit for the electronic apparatus may enable the sub part to be easily opened and closed with respect to the main part by sliding the sub part with respect to the main part using a single hand. In addition, the hinge mechanism may require a certain space, extending radially outwards from a center axis of the hinge mechanism, in order to enable rotation of the sub part with respect to the main part via the hinge mechanism when opening and closing the sub part with respect to the main part, however, the slide unit does not require such a space. Hence, the user may easily carry out the sliding operation to open and close the sub part with respect to the main part, without requiring much space.

The above type of electronic apparatus is described in a Patent Document 1. The slide unit for the electronic apparatus illustrated in the Patent Document 1 includes a slide plate fixed to the sub part, a plate-shaped base fixed to the main part, and guide rails provided on the base and slideably engaging the slide plate.

In addition, the slide plate is attached to the base via a spring whose direction of urging force reverses at an intermediate point of a stroke thereof. Hence, the urging force acts as a reaction force with respect to the user's operation in a first half of the sliding operation in the opening direction, and acts as an assisting force with respect to the user's operation in a second half. Because the urging force of the spring acts as the reaction force and the assisting force, the operability for the user may be improved by requiring the operating force of the user substantially only during the first half of the sliding operation.

The sliding unit may be used in an electronic apparatus having a rectangular parallelepiped shape with a bottom surface that is elongated in a horizontal direction. In the case in which the sub part is configured to slide in a vertical direction with respect to the main part, it may be preferable to minimize an amount of overlap between sub part and the main part in a state in which the sub part is slid open in the vertical direction.

Particularly in the case of the electronic apparatus described above, the main part may include an input device such as the ten-key, a keyboard, or the like. Hence, from the point of view of enabling easy user operation of the input device, it may be preferable to increase the exposed area of the main part in the open state in which the sub part is slid open. In other words, in the open state in which the sub part is slid open in a sliding direction, it may be preferable to minimize the amount of overlap between the sub part and the main part in the sliding direction, in order to maximize the exposed area of the main part in the open state. That is, it may be preferable to minimize the area of the main part hidden by the sub part due to the overlap.

However, the stability of the sub part and the rigidity of parts of the slide plate and the guide rail slideably catching each other need to be maintained when the user operates the sub part in the open state. Hence, it may also be preferable to extend the slideably catching length of the slide plate and the guide rail that slideably catch each other to a certain extent. In other words, from the point of view of the above stability and rigidity, it may be preferable to provide a certain amount of overlap between the sub part and the main part in the open state of the sub part.

PRIOR ART DOCUMENTS

Patent Documents

Patent Document 1: Japanese Laid-Open Patent Publication No. 2008-113067

DISCLOSURE OF THE INVENTION

Problem to be Solved by the Invention

Extending the slideably catching length of the slide plate and the guide rail may be contradictory to sufficiently increasing the exposed area of the main part, in the open state of the sub part. In other words, it may be difficult to simultaneously improve user convenience by providing a sufficiently large exposed area of the main part in the open state of the sub part, and improve the operability for the user by providing a sufficiently large amount of overlap between the sub part and the main part in the open state of the sub part, in order to improve the product characteristic of the electronic apparatus.

Means of Solving the Problem

The present invention is conceived in view of the problem of the prior art described above, and a general object of the present invention is to provide an improved slide unit for an electronic apparatus, that may suppress the problem.

A more specific object of the present invention is to provide a slide unit for an electronic apparatus, that may simultaneously achieve user convenience and operability, in order to improve the product characteristic.

The object described above may be realized by a slide unit for an electronic apparatus, characterized in that there are provided:

a base having a flat surface extending in front and rear directions and having a left end part and a right end part along the front and rear directions on both sides along a width direction perpendicular to top and bottom directions of the flat surface;

a pair of left and right intermediate plates attached to the left end part and the right end part, respectively, to be slideable in the front and rear directions via a first slider mechanism; and a slide plate attached to the pair of left and right intermediate plates to be slideable in the front and rear directions via a second slider mechanism, wherein at least one of the first slider mechanism and the second slider mechanism includes a slide member extending in the front and rear directions; and a sliding member slideably supporting the slide member from both sides of the top and bottom directions and from both sides of the width direction.

When the slid unit for the electronic apparatus is viewed from the front and rear directions, left and right directions may be regarded as the width direction, and upward and downward directions may be regarded as the top and bottom directions.

Effects of the Invention

According to a slide unit for an electronic apparatus according to the present invention, the user convenience and operability may be achieved simultaneously, in order to improve the product characteristic.

BRIEF DESCRIPTION OF THE DRAWING

FIG. 3C is a side view of the electronic apparatus having the slide unit therefore according to the present invention, in the open state;

FIG. 7A is a plan view illustrating the slide unit for the electronic apparatus according to the present invention, in the closed state;

FIG. 10A is a plan view illustrating the slide unit for the electronic apparatus according to the present invention, in the open state;

DESCRIPTION OF THE REFERENCE NUMERALS

S Electronic Apparatus
1 Base Plate (Base)
1a Planar Part
1b Guide Holder
1c Rear Stopper
1d Front Stopper
1e Ear part
2L First Slider Mechanism
2R First Slider Mechanism
3 Sub Slide Plate (Intermediate Plate)
3a Shaft Holder (Fixing Part)
3b Side Surface Part
3c Rail
3d Rear Stopper Catch
3e Front Stopper Catch
4 Sub Slide Plate (Intermediate Plate)
4a Shaft Holder (Fixing Part)
4b Side Surface Part
4c Rail
4d Rear Stopper Catch
4e Front Stopper Catch
5 Second Slider Mechanism
51 Shaft (Slide Member)
52 Shaft Guide (Sliding Member)
52a Inserting Opening
6 Slide Plate (Slider Plate)
6a Flat Plate Part
6b Shaft Guide Holder
6c Spring Front Holder
7 Guide
8 Spring
9 Spring 10 Spring Pin
11 Main Part
12 Sub Part
D1 Slide Unit For Electronic Apparatus
111 Base Plate (Base)
111a Planar Part
111b Shaft Guide Holder
111c Ear Part
2 First Slider Mechanism
21 Shaft
22 Shaft Guide
22a Inserting Opening
5L Second Slider Mechanism
5R Second Slider Mechanism
61 Slide Plate (Slider Plate)
61a Flat Plate Part
61b Guide Holder
61c Rear Stopper
61d Front Stopper
61e Spring Front Holder

MODE OF CARRYING OUT THE INVENTION

A description will hereinafter be given with respect to embodiments of the present invention, by referring to FIGS. 1 through 12 described above. In FIGS. 1 through 12 used to describe first and second embodiments, F denotes a front direction of front and rear directions, U denotes a top direction (upward direction) of top and bottom directions, and R denotes a right direction of right and left directions along a width direction.

First Embodiment

Figure 1:
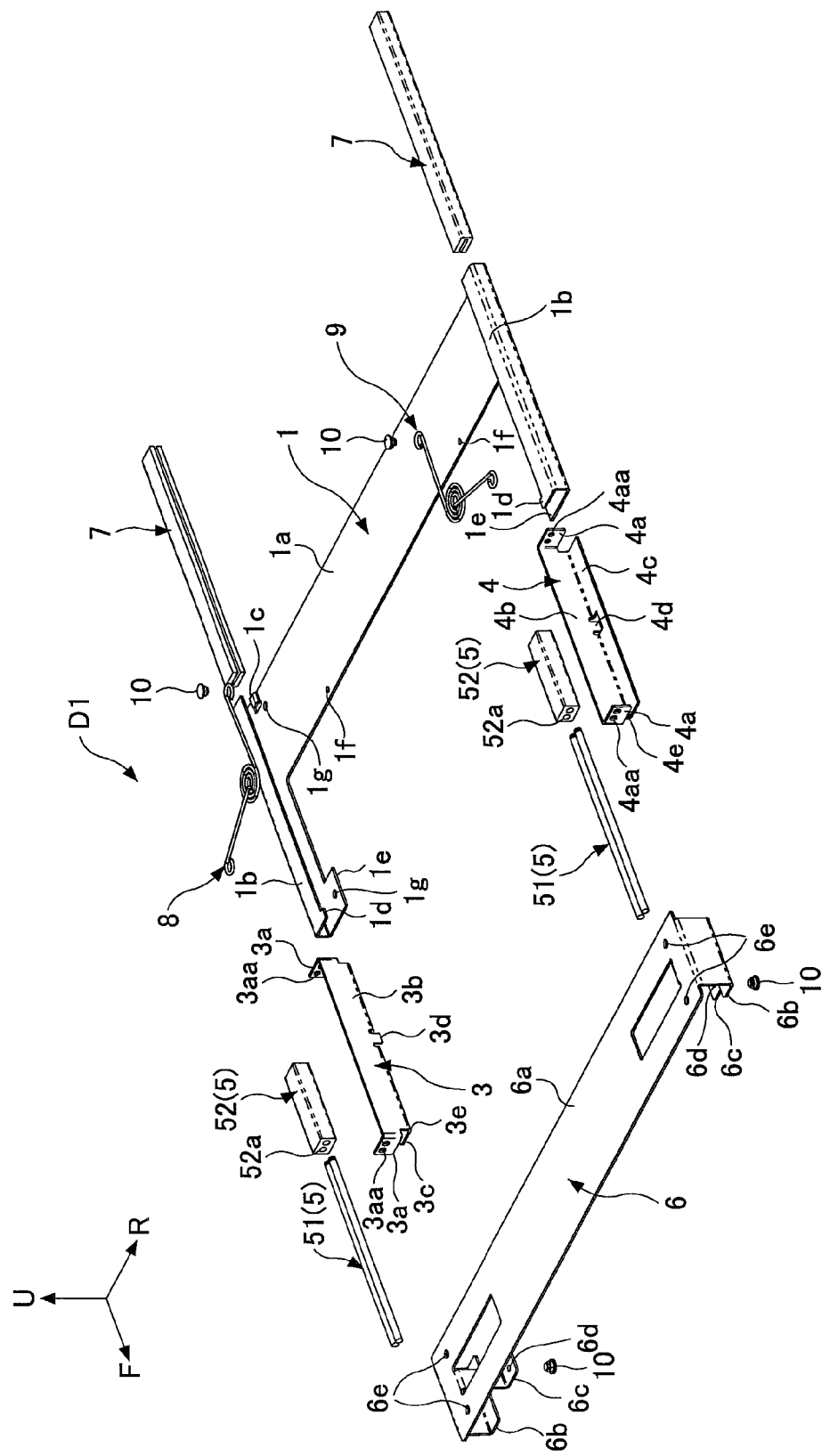
FIG. 1 is a disassembled perspective view from above a slide unit for an electronic apparatus according to the present invention.
Figure 2:
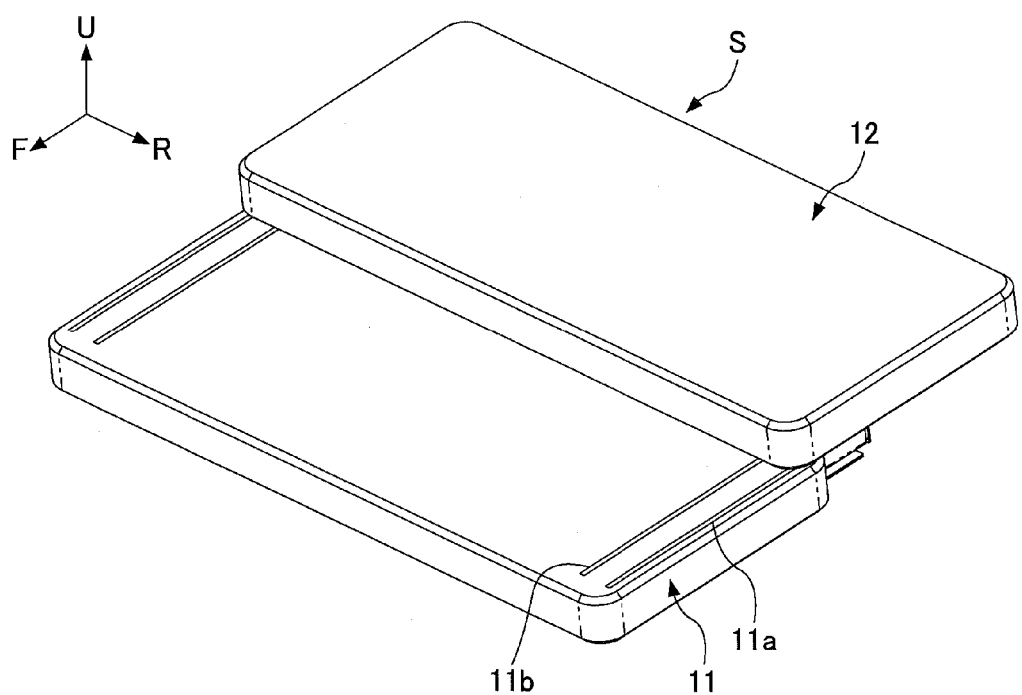
FIG. 2 is a perspective view of the electronic apparatus having the slide unit therefore according to the present invention, in an open state.
Figure 3A:
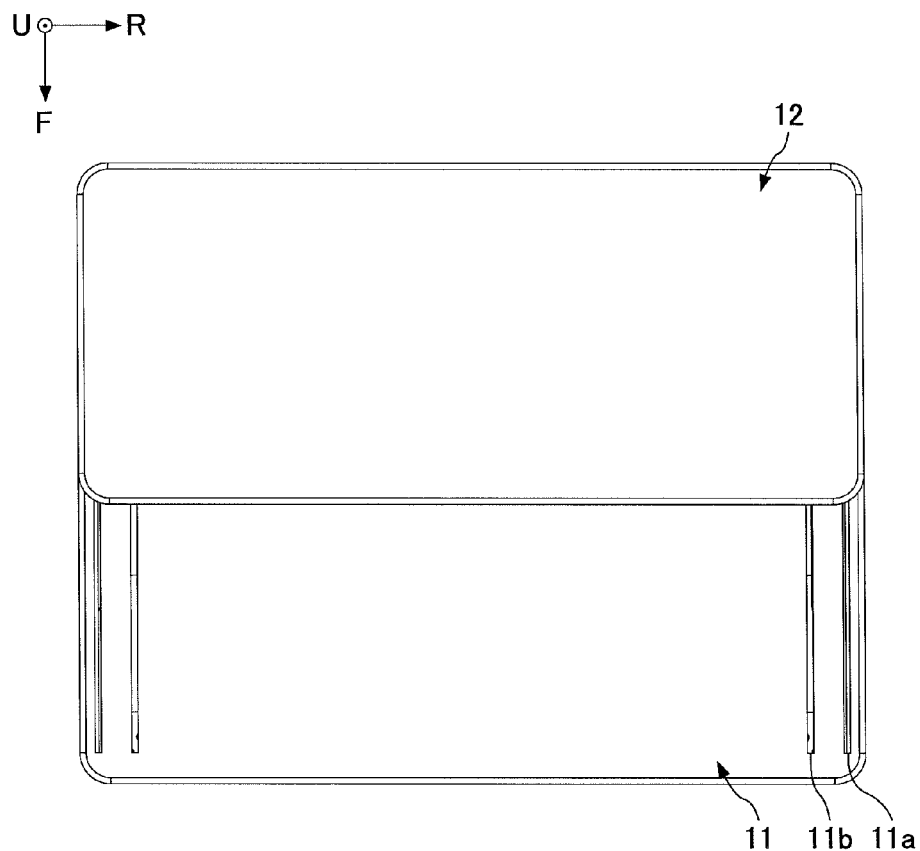
FIG. 3A is a plan view of the electronic apparatus having the slide unit therefore according to the present invention, in the open state.
Figure 3B:
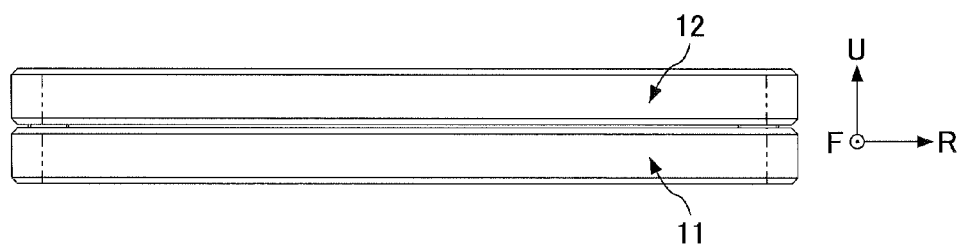
FIG. 3B is a front view of the electronic apparatus having the slide unit therefore according to the present invention, in the open state.
Figure 4:
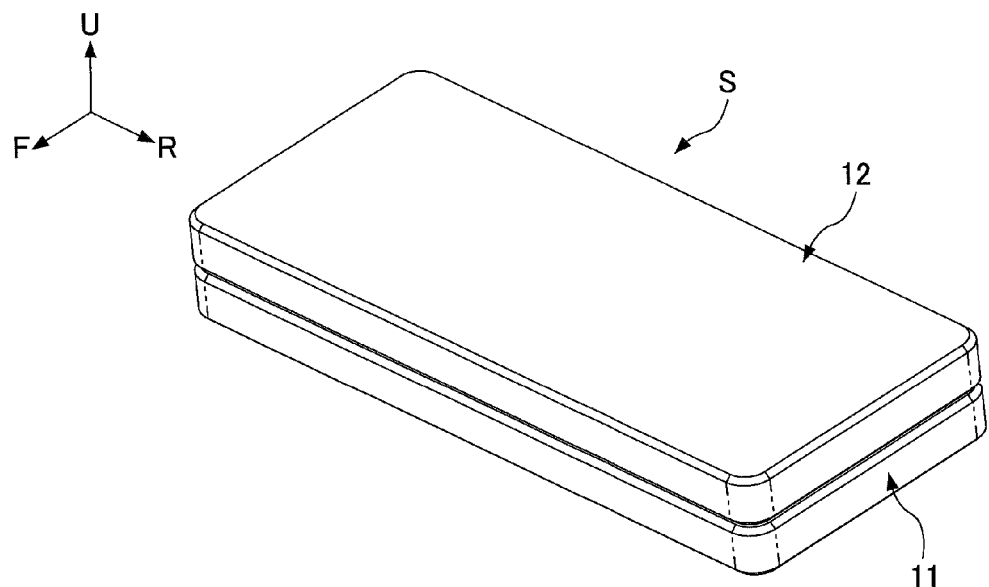
FIG. 4 is a perspective view of the electronic apparatus having the slide unit therefore according to the present invention, in an closed state.
Figure 5A:
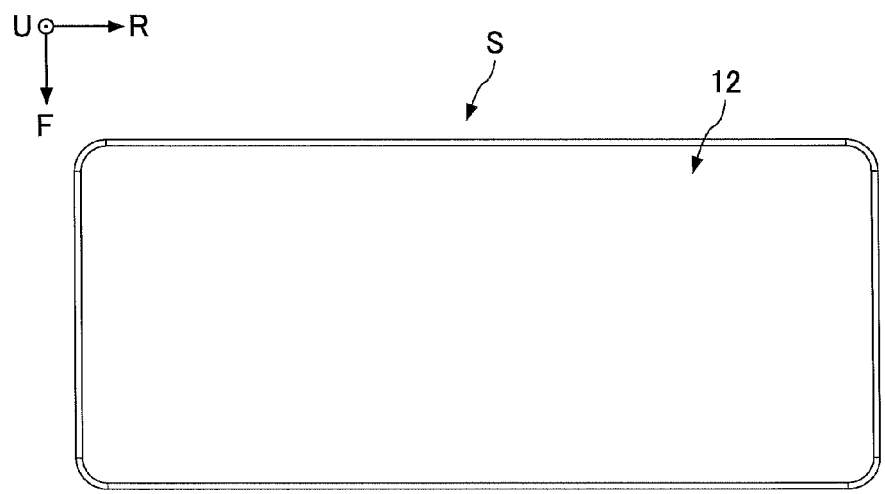
FIG. 5A is a plan view of the electronic apparatus having the slide unit therefore according to the present invention, in the closed state.
Figure 5B:
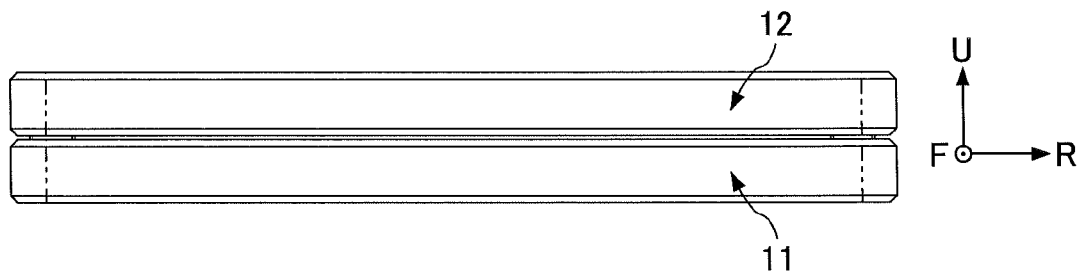
FIG. 5B is a front view of the electronic apparatus having the slide unit therefore according to the present invention, in the closed state.
Figure 5C:
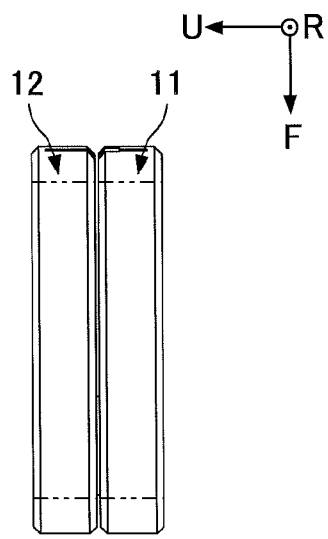
FIG. 5C is a side view of the electronic apparatus having the slide unit therefore according to the present invention, in the closed state.

As illustrated in FIG. 1, a slide unit D1 for an electronic apparatus in the first embodiment includes a base plate (base) 1, and a pair of left and right sub slide plates (intermediate plates) 3 and 4 attached to the base plate 1 and slideable in the front and rear directions via first slider mechanisms 2L (3c+7) and 2R (4c+7) provided on left and right end parts of the base plate, respectively. The base plate 1 includes a planar part 1a extending in the front and rear directions near a center along the width direction, and the left and right end parts provided on both sides along the width direction that is perpendicular to the front and rear directions and to the top and bottom directions of the planar part 1a.

In addition, the slide unit D1 for the electronic apparatus includes a slide plate (slider plate) 6 attached to the pair of left and right sub slide plates 3 and 4 and slideable in the front and rear directions via a second slider mechanism 5, a guide 7, a spring 8, a spring 9, and a spring pin 10.

Further, the slide unit D1 for the electronic apparatus includes a shaft (slide member) 51 extending in the front and rear directions, and a shaft guide (sliding member) 52 that slideably supports the shaft on both sides of the top and bottom directions and on both sides of the width direction. In this example, the second slider mechanism 5 is formed by the shaft 51 and the shaft guide 52, however, at least one of the first and second slider mechanisms 2L and 2R, and 5, may be formed by the shaft 51 and the shaft guide 52.

In this first embodiment, the shaft 51 may be made of a metal and have a cylindrical column shape, and the shaft guide 52 may have a rectangular column shape. The shaft guide 52 has an inserting opening 52a, that is formed by an inner peripheral surface thereof and has a shape corresponding to the cylindrical shaft 51. One shaft guide 52 includes two inserting holes 52a arranged side by side in the width direction, in order to receive two shafts 51.

In other words, in this first embodiment, the inner peripheral surface of the shaft guide 52 forming the inserting opening 52a may make contact with an outer peripheral surface of the shaft 51 extending in the front and rear directions, for the entire region along a circumferential direction of the shaft 51. A length of the shaft 51 in the front and rear directions may be set to approximately two times that of the shaft guide 52.

A shaft holder 3a may be provided on both ends along the front and rear directions of the sub slide plate 3 on the left side, as a fixing part to fix respective end parts of the two shafts 51 along the front and rear directions. Similarly, a shaft holder 4a may be provided on both ends along the front and rear directions of the sub slide plate 4 on the right side, as a fixing part to fix respective end parts of the two shafts 51 along the front and rear directions.

The base plate 1 may be formed by pressing and bending a metal plate member, to include the planar part 1a extending in the front and rear directions near the center along the width direction. A part of the base plate 1 located on the outer side of the planar part 1a along the width direction may once be bent vertically in the top direction, and after extending vertically for approximately the same thickness as the guide 7, then be bent towards the inner side along the width direction, in order to form a guide holder 1b. The guide holder 1b may be formed to extend in the front direction by a length that is approximately two times the length near the planar part 1a along the front and rear direction.

The sub slide plates 3 and 4 may be formed by pressing and bending a metal plate member, in a manner similar to forming the base plate 1. The sub slide plates 3 and 4 may have shapes that are symmetrical to the left and right with respect to the center along the width direction, and have mutually separate structures. The sub slide plates 3 and 4 respectively include side surface parts 3b and 4b forming a planar surface having a rectangular shape elongated in the front and rear directions perpendicular to the width direction. Rails 3c and 4c project towards the outer side in the width direction from the bottom side edge of the respective side surface parts 3b and 4b, and extend in the front and rear directions.

Rear stopper catches 3d and 4d that project in the bottom direction are provided near the center along the front and rear directions of the bottom side edge of the side surface parts 3b and 4b. The shaft holders 3a and 4a may be formed to project on the outer side in the width direction, from the front end part to the rear end part of the respective side surface parts 3b and 4b. The shaft holder 3a includes two openings 3a a arranged side by side in the width direction to receive both end parts of the shafts 51 along the front and rear directions, which end parts of the shafts 51 are fitted into the two openings 3a a. Similarly, the shaft holder 4b includes two openings 4a a arranged side by side in the width direction. A front stopper catch 3e is formed on a wall surface on the front side of the side surface part 3b located on the bottom surface side of the shaft holder 3a located on the front direction side. Similarly, a front stopper catch 4e is formed on a wall surface on the front side of the side surface part 4b located on the bottom surface side of the shaft holder 4a located on the front direction side.

A slit-shaped gap extending in the width direction when viewed from the front and rear direction is formed between the end part of the rail 3c along the front and rear directions and the shaft holder 3a, and between the end part of the rail 4c along the front and rear directions and the shaft holder 4a. The provision of such gaps avoids the sub slide plates 3 and 4 from interfering with the pair of left and right guides 7 and pair of left and right guide holders 1b, when the rails 3c and 4c slide in the front and rear directions with respect to the pair of left and right guides 7.

The slide plate 6 may be formed by pressing and being a metal plate member that is longer along the width direction with respect to the length along the front and rear directions. A flat plate part 6a at an intermediate location including the center along the width direction is offset in the top direction with respect to the planar part 1a of the base plate 1, and lies on a plane parallel to the planar part 1a.

A part of the metal plate member located on the outer side of the flat plate part 6a along the width direction may once be bent vertically in the bottom direction, and after extending vertically, then be bent towards the inner side along the width direction to be parallel to the flat plate part 6a, in order to form a shaft guide holder 6b to hold the shaft guide 52. The length of the shaft guide holder 6b in the front and rear directions may be slightly shorter than that of the shaft guide 52. Hence, contact of the end surfaces of the shaft guide 52 along the front and rear direction with the shaft holders 3a and 4a may be ensured.

A part of the flat plate part 6a located on the inner side of the shaft guide holder 6b along the width direction may be formed in a tongue shape by punching, then bent in the bottom direction, and further bent again towards the inner side along the width direction, in order to form a spring front holder 6c.

The shaft guide holder 6c forms a pair of left and right corner parts extending in the front and rear directions. The shaft guide 52 engages the corner part, and may be bonded by a suitable means such as insert molding and the like. The shaft guide 52 may be made of a resin, such as polyacetal and the like, in order to provide satisfactory slippage with respect to the shaft 51.

In this first embodiment, the pair of left and right guides 7 that slideably guide the pair of left and right rails 3c and 4c of the sub slide plates 3 and 4 along the front and rear direction, engage the pair of left and right guide holders 1b of the base plate 1, and are bonded thereto by the suitable means such as the insert molding and the like. The guides 7 may be made of a resin, such as polyacetal and the like, in order to provide satisfactory slippage with respect to the rails 3c and 4c.

A rear stopper 1c that projects towards the top direction is formed on the rear side on both side parts of the base plate 1 along the width direction. A front stopper 1d that projects towards the inner side along the width direction is formed on the front end parts along the front direction on the top direction side of the guide holder 1b. An ear part 1e that projects towards the inner side along the width direction is formed on the rear of the front end parts along the front direction on the bottom direction side of the guide holder 1b.

The slide unit D1 for the electronic apparatus described above may be assembled in the manner described in the following. The pair of left and right shaft guides 51 may be mounted on the corresponding pair of left and right shaft guide holders 6b of the slide plate 6. Thereafter, the sub slide plate 3 may be placed from the inner side along the width direction of the shaft guide 52, in order to match the positions of the two openings 3a a in the shaft holder 3a and the two inserting openings 52a of the shaft guide 52 along the width direction. In this state, the rear end side of the two shafts 51 are inserted into the two openings 3a a of the shaft holder 3a on the front side.

Further, the two shafts 51 are inserted into the rear of the openings 3a a to pass through the inserting opening 52a of the shaft guide 52. After inserting the rear end side of the two shafts 51 into the two openings 3a a in the shaft holder 3a on the rear side, head parts of the two shafts 51 projecting towards the rear from the two openings 3a a in the shaft holder 3a on the rear side are caulked, in order to fix the two shafts 51 to the shaft holder 3a.

Thereafter, the pair of left and right guides 7 are mounted on the pair of left and right guide holders 1b of the base plate 1, respectively. The rail 3c of the left sub slide plate 3 is inserted into a groove part of the left guide 7, and the right rail 4c is inserted into a groove part of the right guide 7.

One end of each of the springs 8 and 9 engages a hole if located on the center side of the planar part 1a of the base plate 1 along the width direction, and the other end of each of the springs 8 and 9 engages a hole 6d formed in the spring front holder 6c of the slide plate 6. The slide unit D1 for the electronic apparatus in this first embodiment may be formed in this manner.

A screw that is not illustrated is inserted through a hole 1g formed at the four corners at the front, rear, left and right, in the planar part 1a and the ear part 1e of the base plate 1, and is screwed into a threaded part that is not illustrated and is formed in a main part 11 of an electronic apparatus S illustrated in FIG. 2, FIGS. 3A through 3C, FIG. 4, and FIGS. 5A through 5C (hereinafter simply referred to as FIGS. 2 through 5), to thereby fix the base plate 1 to the main part 11. A screw that is not illustrated is inserted through a hole 6e formed at the four corners at the front, rear, left and right, in the slide plate 6, and is screwed into a threaded part that is not illustrated and is formed in a sub part 12 of the electronic apparatus S illustrated in FIGS. 2 through 5, to thereby fix the slide plate 6 to the sub part 12.

The front direction of the front and rear directions illustrated in FIG. 1 is the direction in which the sub part 12 slides towards a closed position illustrated in FIG. 4 and FIGS. 5A through 5C in which the sub part 12 completely overlaps the main part 11 along the front and rear directions. This front direction is the direction towards the user when the user uses the electronic apparatus S including the slide unit D1.

As illustrated in FIG. 2 and FIGS. 3A through 3C, the front side surface of the main part 11 is formed with a slit 11a to which the wall surface part extending towards the bottom direction of the shaft guide holder 6b of the slide plate 6 is inserted to be slideable in the front and rear directions. The front surface side surface of the main part 11 is formed with a slit 11b to which the wall surface part extending towards the bottom direction of the spring front holder 6c is inserted to be slideable in the front and rear directions, on the inner side of the slit 11a in the width direction.

As illustrated in FIG. 4 and FIGS. 5A through 5C, the shaft guide holder 6b and the spring front holder 6c are accommodated inside the main part 11. In the closed state, the sub slide plates 3 and 4 are also accommodated inside the main part 11. As illustrated in FIG. 2 and FIGS. 3A through 3C, in a final stage of the sub slide plates 3 and 4 moving from the closed position to the open position, the shaft holders 3a and 4a and the rails 3c and 4c on the rear direction side from the rear direction end of the main part 11, and the side part along the rear direction of the shaft guide holder 6b, become exposed from the main part 11.

The main part 11 includes a space to permit sliding of the shaft guide holder 6b, the spring front holder 6c, and the sub slide plate 3 in the front and rear directions, and to permit deformation and eccentricity caused by expansion and contraction of the springs 8 and 9.

Next, a description will be given of a slide operation of the slide unit D1 for the electronic apparatus in this first embodiment. As illustrated in FIG. 4 and FIGS. 5A through 5C, when the sub part 12 in the open state illustrated in FIG. 2 and FIGS.

Figure 6:
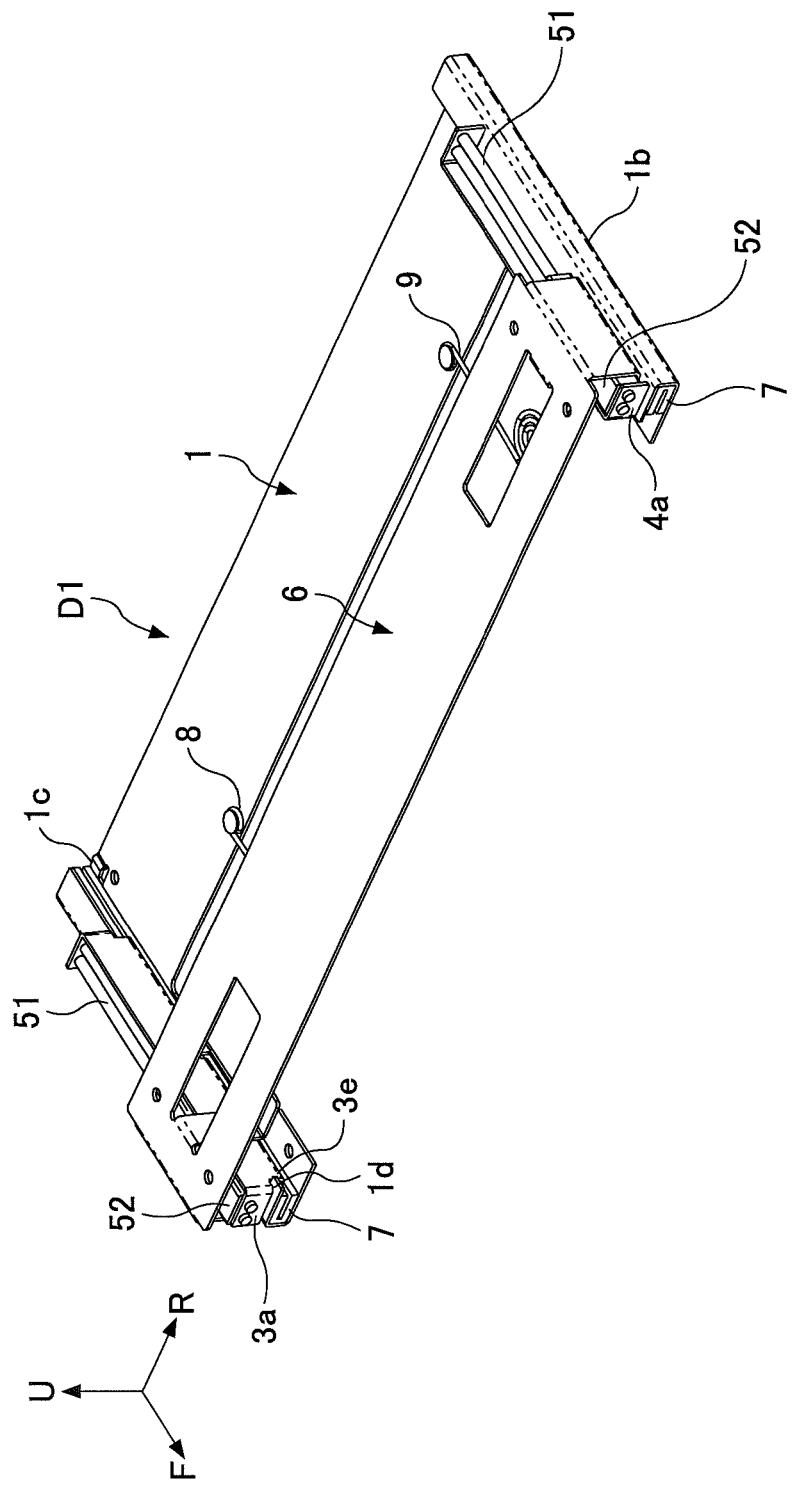
FIG. 6 is a perspective view illustrating the slide unit for the electronic apparatus according to the present invention, in the closed state.
Figure 7B:
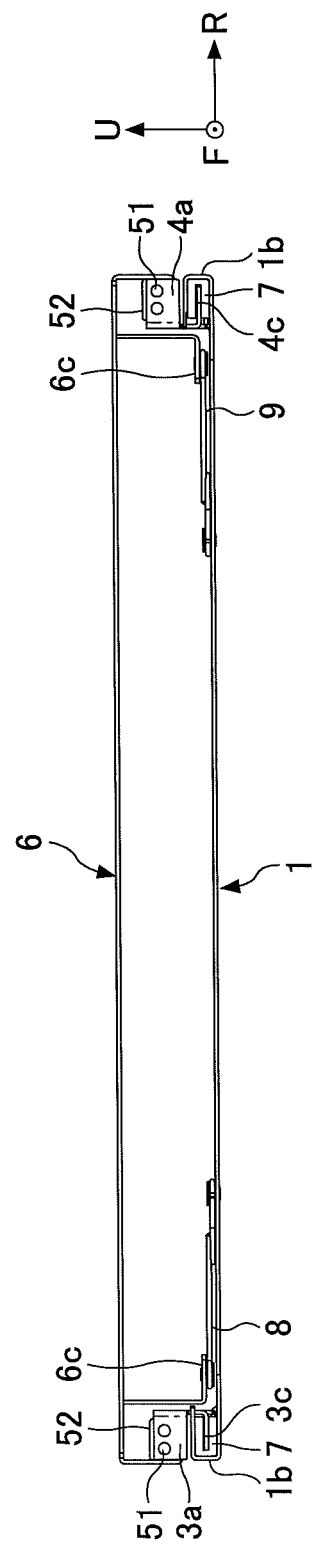
FIG. 7B is a front view illustrating the slide unit for the electronic apparatus according to the present invention, in the closed state.
Figure 7C:
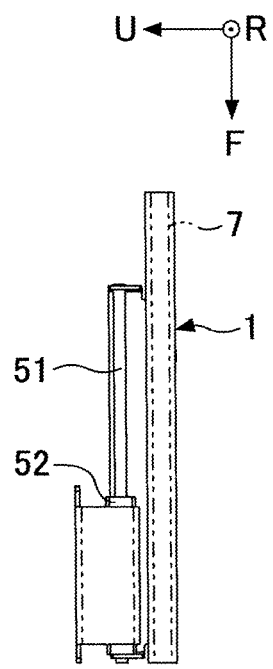
FIG. 7C is a side view illustrating the slide unit for the electronic apparatus according to the present invention, in the closed state.

3A through 3C is moved by a maximum limit in the front direction of the front and rear directions with respect to the main part 11 to the closed state, the slide plate 6 slides with respect to the base plate 1 in the front direction to a position closest to the base plate 1, as illustrated in FIG. 6, FIGS. 7A through 7C, and FIGS. 8A through 8C (hereinafter simply referred to as FIGS. 6 through 8). As illustrated in FIG. 2 and FIGS. 3A through 3C, when the sub part 12 is moved by a maximum limit in the rear direction of the front and rear directions with respect to the main part 11 to the open state, the slide plate 6 slides with respect to the base plate 1 in the rear direction to a position farthest from the base plate 1, as illustrated in FIG. 9 and FIGS. 10A through 10C.

When making the transition from the closed state illustrated in FIGS. 6 through 8 to the open state illustrated in FIG. 9 and FIGS. 10A through 10C, the rail 3c forming the left first slider mechanism 2L slides in the rear direction with respect to the left guide 7, and the rear stopper catch 3d of the left sub slide plate 3 makes contact with the rear stopper 1c the left rear stopper 1c of the base plate 1. At the same time, the rail 4c forming the right first slider mechanism 2R slides in the rear direction with respect to the right guide 7, and the rear stopper catch 4d of the right sub slide plate 4 makes contact with the rear stopper 1c the right rear stopper 1c of the base plate 1.

Similarly, the shaft guide 52 forming the left second slider mechanism 5 slides in the rear direction with respect to the two left shafts 51, and the end surface on the rear direction side of the left shaft guide 52 makes contact with the shaft holder 3a on the rear direction side of the left sub slide plate 3. At the same time, the shaft guide 52 forming the right second slider mechanism 5 slides in the rear direction with respect to the two right shafts 51, and the end surface on the rear direction side of the right shaft guide 52 makes contact with the shaft holder 4a on the rear direction side of the right sub slide plate 4.

When making the transition from the closed state to the open state, the slide operation of the first slider mechanisms 2L and 2R may be carried out before the slide operation of the pair of right and left second slider mechanisms 5, or vice versa. According to the slide unit D1 for the electronic apparatus in this first embodiment, when making the transition from the closed state to the open state, the springs 8 and 9 apply a reaction force with respect to the operating force of the user up to an intermediate point between the closed and open states, but apply an assisting force with respect to the operating force beyond the intermediate point. In addition, the springs 8 and 9 apply a holding force to hold the open state when no operating force of the user is applied in the open state.

When making a transition from the open state illustrated in FIG. 9 and FIGS. 10A through 10C to the closed state illustrated in FIGS. 6 through 8, the rail 3c forming the left first slider mechanism 2L slides in the front direction with respect to the left guide 7, and the front stopper catch 3e of the left sub slide plate 3 makes contact with the left front stopper 1d of the base plate 1. At the same time, the rail 4c forming the right first slider mechanism 2R slides in the front direction with respect to the right guide 7, and the front stopper catch 4e of the right sub slide plate 4 makes contact with the right front stopper 1d of the base plate 1.

Similarly, the shaft guide 52 forming the left second slider mechanism 5 slides in the front direction with respect to the two left shafts 51, and the end surface on the front direction side of the left shaft guide 52 makes contact with the shaft holder 3a on the front direction side of the left sub slide plate 3. At the same time, the shaft guide 52 forming the right second slider mechanism 5 slides in the front direction with respect to the two right shafts 51, and the end surface on the front direction side of the right shaft guide 52 makes contact with the shaft holder 4a on the front direction side of the right sub slide plate 4.

When making the transition from the open state to the closed state, the slide operation of the first slider mechanisms 2L and 2R may be carried out before the slide operation of the pair of right and left second slider mechanisms 5, or vice versa. According to the slide unit D1 for the electronic apparatus in this first embodiment, when making the transition from the open state to the closed state, the springs 8 and 9 apply a reaction force with respect to the operating force of the user up to the intermediate point between the open and closed states, but apply an assisting force with respect to the operating force beyond the intermediate point. In addition, the springs 8 and 9 apply a holding force to hold the closed state when no operating force of the user is applied in the closed state.

According to the slide unit D1 for the electronic apparatus, and the electronic apparatus S including the slide unit D1 in this first embodiment, the following functions may be obtained. In other words, in the slide unit D1 for the electronic apparatus, when the slide plate 6 is moved by a maximum limit in the rear direction of the front and rear directions with respect to the base plate 1, the amount of overlap between the base plate 1 and the slide plate 6 in the front and rear directions may be minimized as illustrated in FIG. 2 and FIGS. 3A through 3C.

Hence, in the electronic apparatus S, when the sub part 12 is moved by the maximum limit in the rear direction with respect to the main part 11, the area of the exposed surface of the main part 11 may be made large to improve the user convenience. Particularly when the input device, such as the ten-key, compact keyboard, and the like, is provided at the exposed surface, each individual key may be made large, the restrictions on the key layout may be minimized, and the number of function keys and the like provided on the exposed surface may be increased, to thereby achieve greatly improved user convenience.

In addition, the amount of overlap between the rail 3c or 4c and the guide 7 in the front and rear directions, and the amount of overlap between the shaft and the shaft guide 52 in the front and rear direction may both be set to maximized values. Hence, the relative deviation and the relative rotation of the sub part 12 with respect to the main part 11 of the electronic apparatus S may be suppressed as much as possible. Particularly in this first embodiment, a play caused by the moment about the center in the top and bottom directions may be prevented, to thereby improve the user convenience.

In the case of a slider mechanism that is a combination of the rails utilizing the pair of left and right side edges of the flat plate, and the guides having the sideways U-shaped cross section covering the outer sides of the rails in the top and bottom directions and the width direction, the guides support the rails from both sides of the top and bottom directions and from the outer side of the width direction. According to this structure, the support from the inner side in the width direction of one rail depends on the supporting force from the outer side in the width direction of the other rail. Hence, the pair of left and right rails may be required to be attached, and a space may be required for attaching members, that is, for enabling the flat plate to slide in the front and rear directions.

The above requirements may be satisfied according to the slide unit D1 for the electronic apparatus in this first embodiment. The requirements may be satisfied because the first slider mechanisms 2L and 2R and one of the second slider mechanisms 5 include the two shafts 51 extending in the front and rear directions, and the shaft guide 52 that slideably supports the two shafts 51 from four directions spaced at 90 degrees apart from each other, on both sides along the top and bottom directions and on both sides along the width direction about the front and rear directions regarded as the center.

In other words, because the shaft 51 included in the second slider mechanism 5 is supported by the shaft guide 52 from the inner side in the width direction, the pair of sub slide plates 3 and 4 may be provided on the left and right to be mutually separate. Thus, the attaching members to attach the pair of sub slide plates 3 and 4 in the width direction may be omitted, and the space to enable moving of the sub slide plates 3 and 4 within the main part 11 may be reduced by concentrating the space on both sides on the left and right.

Figure 8A:
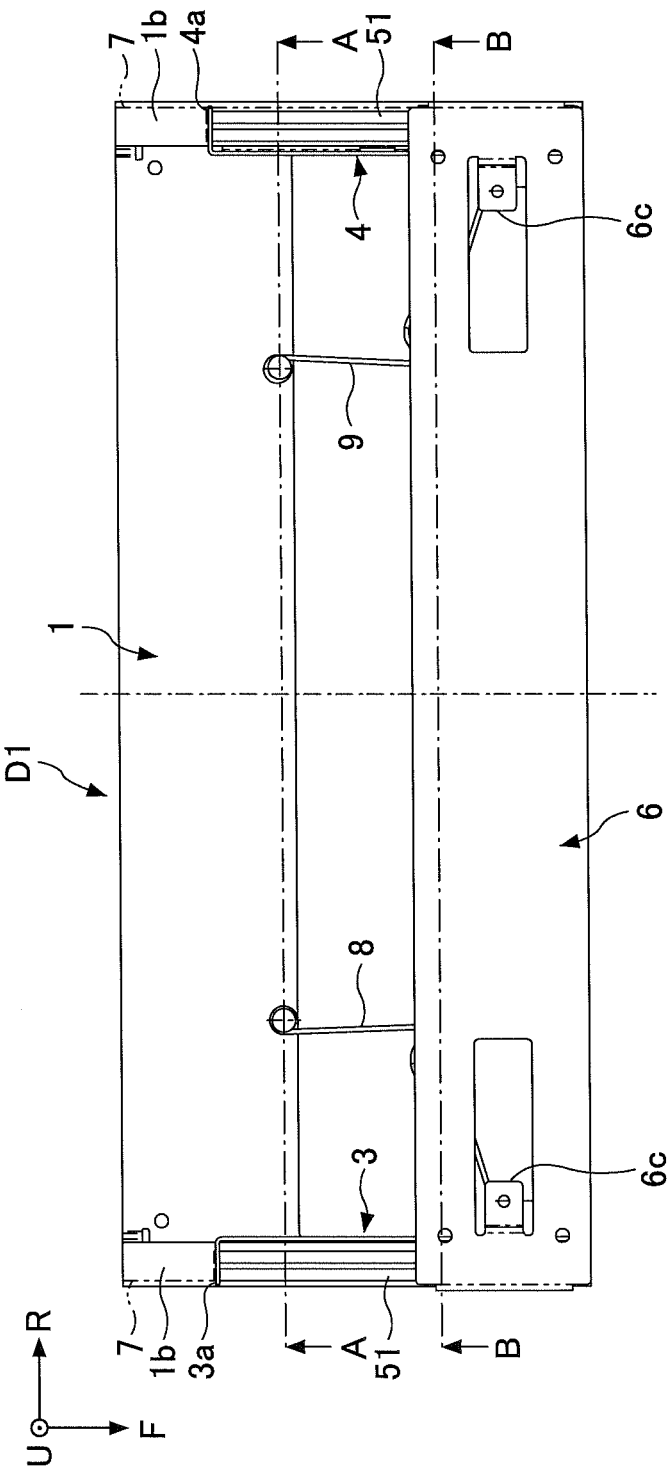
FIG. 8A is a plan view of the slide unit for the electronic apparatus according to the present invention, in the closed state.
Figure 8B:
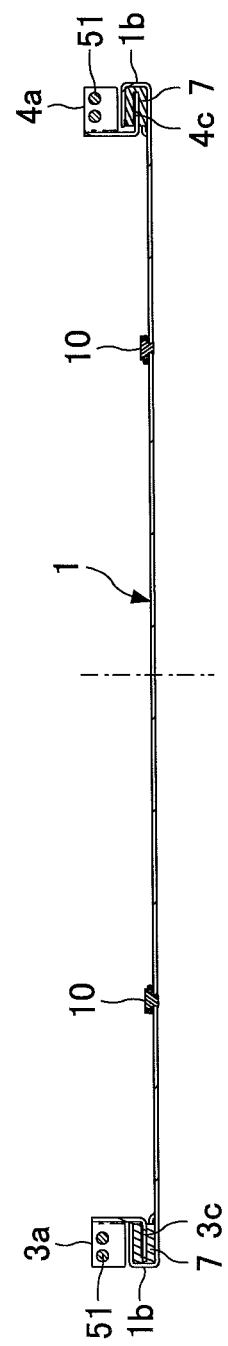
FIG. 8B is a cross sectional view along a line A-A in FIG. 8A.
Figure 8C:
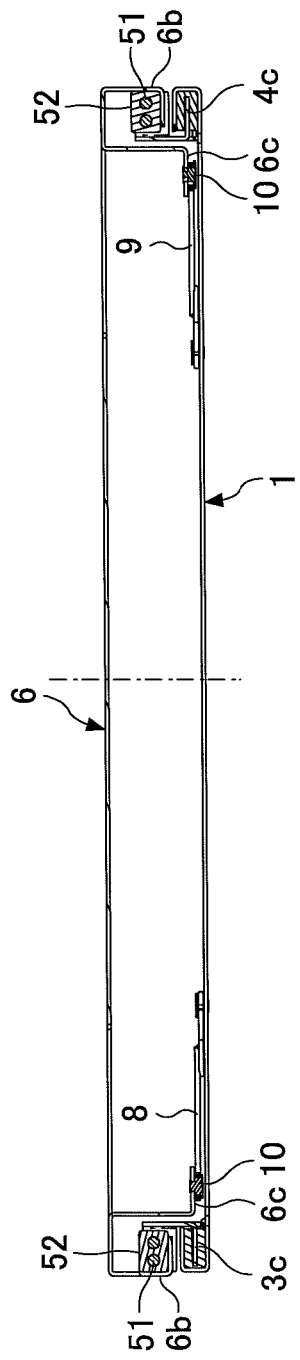
FIG. 8C is a cross sectional view along a line B-B in FIG. 8A.
Figure 9:
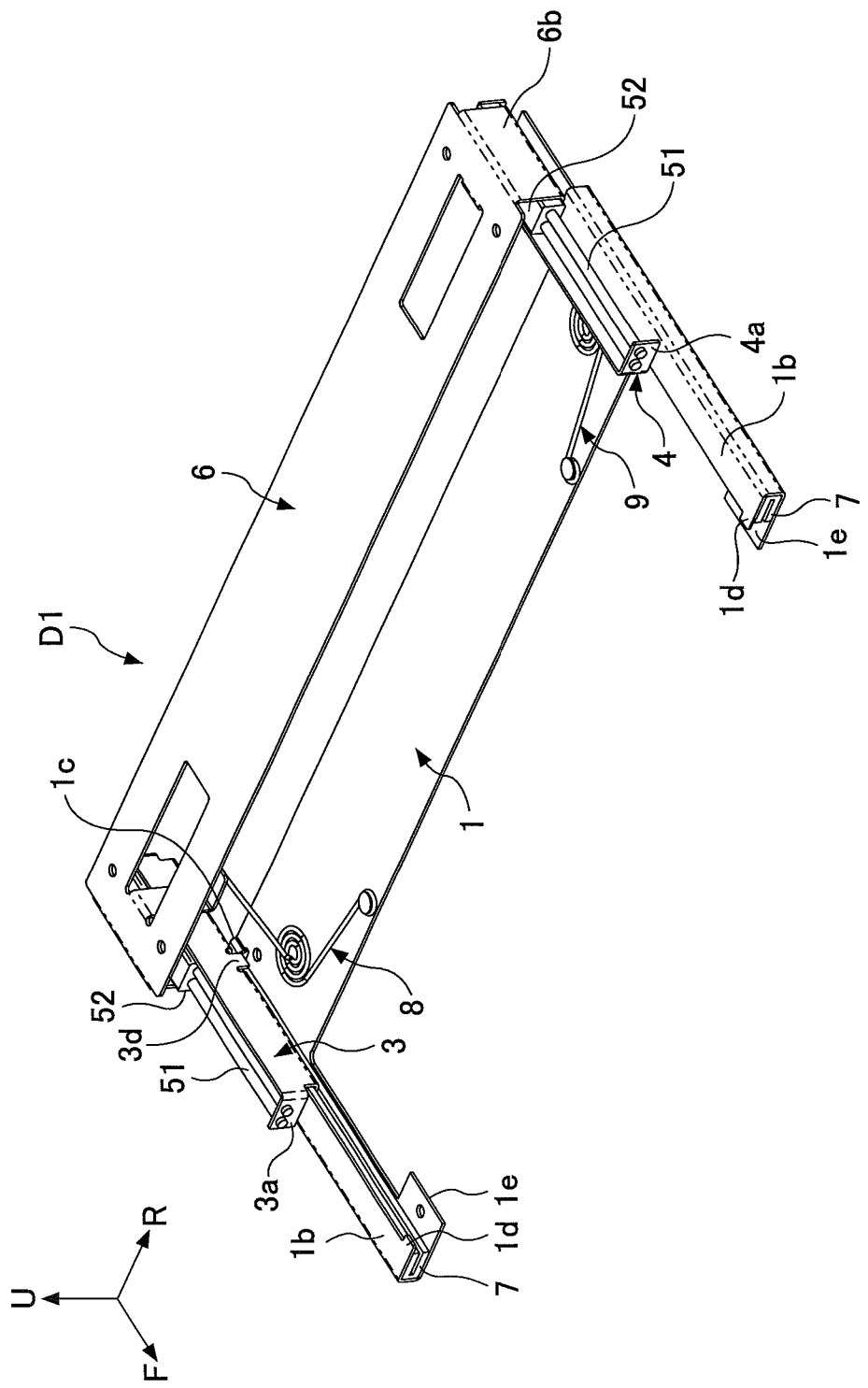
FIG. 9 is a perspective view illustrating the slide unit for the electronic apparatus according to the present invention, in the open state.
Figure 10B:
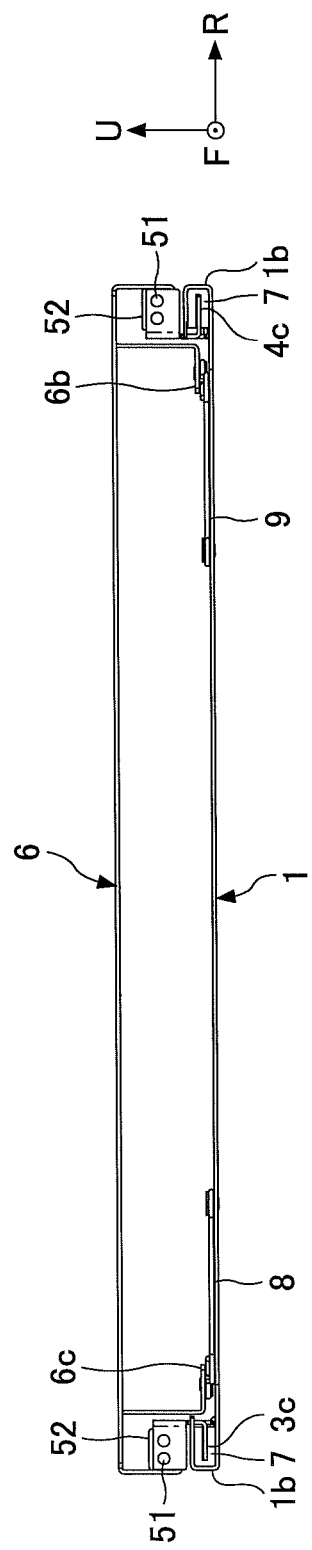
FIG. 10B is a front view illustrating the slide unit for the electronic apparatus according to the present invention, in the open state.
Figure 10C:
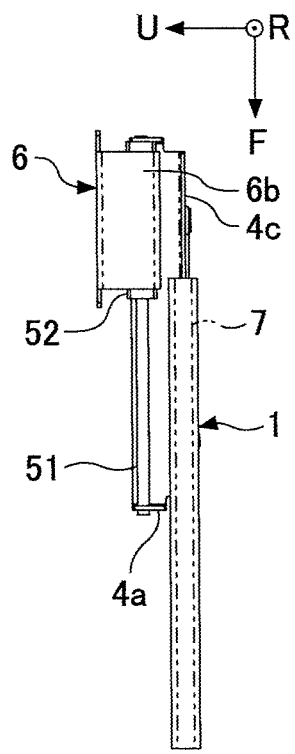
FIG. 10C is a side view illustrating the slide unit for the electronic apparatus according to the present invention, in the open state.

In addition, because the sub slide plates 3 and 4 are formed by providing the side surface parts 3b and 4b perpendicular to the width direction, forming the shaft holders 3a and 4a to project towards the outer side in the width direction from both end edges in the front and rear directions, and similarly forming the rails 3c and 4c to project towards the outer side in the width direction from the edge parts on the bottom direction side, the rails 3c and 4c and the shafts 51 may be arranged to overlap in the width direction, as illustrated in FIGS. 8A through 8C.

Accordingly, the shaft guide 52 and the guide 7 may be arranged to overlap in the width direction, and the second slider mechanism 5 and the first slider mechanism 2 may be concentrated on the outer side in the width direction, so that the space on the inner side in the width direction may be efficiently utilized. In this first embodiment, the pair of sub slide plates 3 and 4 are arranged separately on the left and right, and in addition to not requiring a member for attachment in the width direction, the layout of the parts not contributing to the sliding and the routing of the wiring may be concentrated on the inner side in the width direction, to thereby enable the internal layout and the routing to be carried out efficiently.

Further, in the slid unit D1 for the electronic apparatus in this first embodiment, the inner peripheral surfaces of the shaft guide 52 forming the inserting openings 52a make contact with the outer peripheral surfaces of the two cylindrical shafts 51 that are arranged side by side in the width direction, for the entire region along the circumferential direction of each shaft 51. For this reason, the force of constraint of the shaft guide 52 with respect to the shaft 51 may be increased.

Due to the increase in the force of constraint, it may be possible to minimize the relative rotation in which the slide plate 6 rotates about a center in the top and bottom directions relative to the base plate 1. Hence, the above described relative rotation of the sub part 12 fixed on the slide plate 6, mainly about the center along the top and bottom directions, may be suppressed to improve the operability.

Figure 11A:
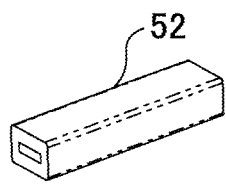
FIG. 11A is a perspective view of a shaft included in the slide unit for the electronic apparatus according to the present invention, in another embodiment.
Figure 11B:
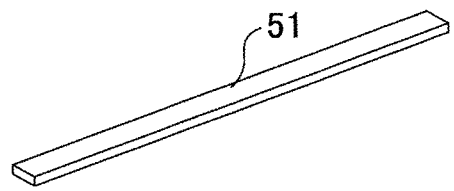
FIG. 11B is a perspective view of a shaft guide included in the slide unit for the electronic apparatus according to the present invention, in another embodiment.

In this first embodiment, two shafts 51 are arranged side by side in the width direction, however, three or more shafts 51 may be arranged side by side in the width direction. In addition, instead of arranging a plurality of cylindrical shafts 51 side by side in the width direction, the shaft 51 may be formed to a rectangular plate shape having a longer side in the front and rear directions perpendicular to the top and bottom directions, as illustrated in FIGS. 11A and 11B. The inserting opening in the shaft guide 52 may also be shaped so that the inner peripheral surface forming the inserting opening makes contact with the peripheral surfaces of the rectangular plate-shaped shaft 51 for the entire region in the peripheral direction of the rectangular plate-shaped shaft 51.

Figure 11C:
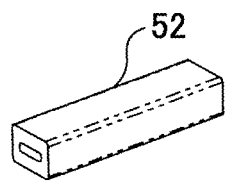
FIG. 11C is a perspective view of the shaft included in the slide unit for the electronic apparatus according to the present invention, in another embodiment.
Figure 11D:
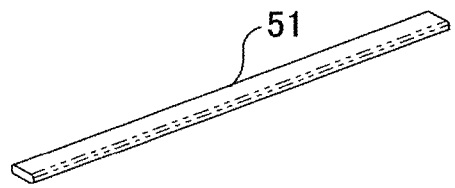
FIG. 11D is perspective view of the shaft guide included in the slide unit for the electronic apparatus according to the present invention, in another embodiment.

Moreover, as illustrated in FIGS. 11C and 11D, the four corners of the rectangular plate-shaped shaft 51 illustrated in FIGS. 11A and 11B may be suitably rounded, so that the shape within a cross section perpendicular to the front and rear directions is rectangular with rounded corners. The inserting opening in the shaft guide 52 may have a shape corresponding to the shape of the shaft 51.

In the slide unit D1 for the electronic apparatus in this first embodiment, the pair of left and right sub slide plates 3 and 4 are distinguished by the reference numerals. However, in a case in which the rear stopper catch 3d is located at the center along the front and rear directions of the sub slide plate 3 and the rear stopper catch 4d is located at the center along the front and rear directions of the sub slide plate 4, the left and right sub slide plates 3 and 4 may be realized by a common part.

In the first embodiment described above, the first slider mechanism has a structure using a rail and a sideways U-shaped guide, and the second slider mechanism has a structure using a shaft and a shaft guide supporting the shaft from both sides along the top and bottom directions and from both sides along the width direction. However, such a combination may be appropriately modified. In other words, the second slider mechanism may have the structure using a rail and a sideways U-shaped guide, and the first slider mechanism may have the structure using a shaft and a shaft guide supporting the shaft from both sides along the top and bottom directions and from both sides along the width direction. A description will be given of such structures for a second embodiment.

Second Embodiment

In a slide unit D2 for the electronic apparatus in the second embodiment, the sub slide plates 3 and 4 and the guides 7 may be the same as those of the first embodiment. However, the direction in which the sub slide plates 3 and 4 extend is reversed in the top and bottom directions when compared to the first embodiment.

A main difference from the slide unit D1 for the electronic apparatus in the first embodiment described above is that a guide holder 61b that holds the guide 7 forming the second slider mechanism 5 is provided on a slide plate (slider plate) 61, and a shaft guide holder 111b that holds a shaft guide 22 forming the first slider mechanism 2 is provided on a base plate (base) 111.

Due to the main difference, the constituent elements different from those of the slide unit D1 for the electronic apparatus in the first embodiment are the base plate 111 and the slide plate 61 which will be described hereinafter.

Figure 12:
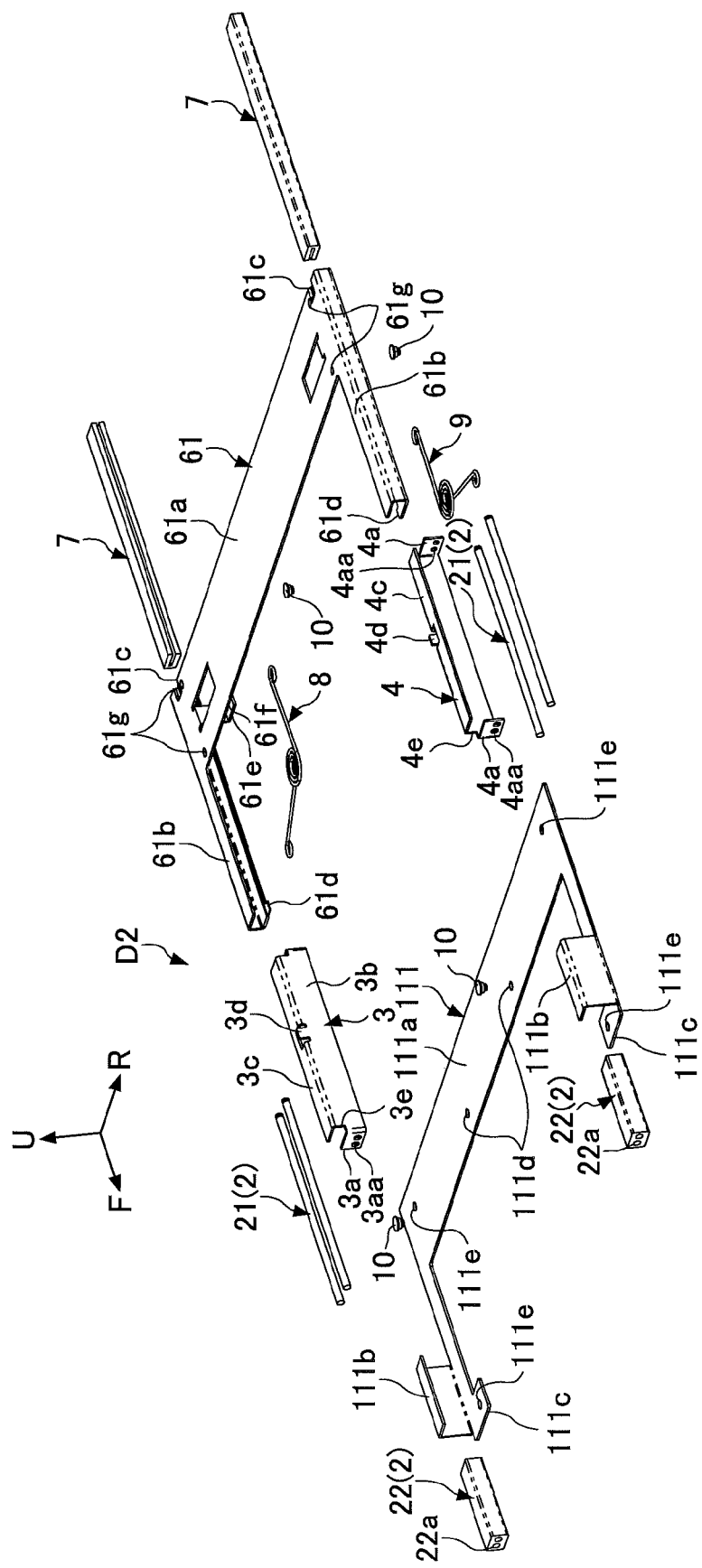
FIG. 12 is a disassembled perspective view from under the slide unit for the electronic apparatus according to the present invention.

As illustrated in FIG. 12, the base plate 111 may be formed by pressing and bending a metal plate member, to include a planar part 111a extending in the front and rear directions near the center along the width direction.

A part of the base plate 111 located on the outer side of the planar part 111a along the width direction and located on the front direction side may once be bent vertically in the top direction, and after extending vertically for approximately the two times the thickness of the shaft guide 22, then be bent towards the inner side along the width direction, in order to form a shaft guide holder 111b. The shaft guide holder 111b may be formed to extend in the front and rear directions by a length that is slightly shorter than the shaft guide 22, in order to ensure contact with the shaft holders 3a and 4a of the sub slide plates 3 and 4.

The slide plate 61 may be formed by pressing and bending a metal plate member that is longer in the width direction than along the front and rear directions, in a manner similar to forming the base plate 111. A flat plate part 61a at an intermediate location including the center along the width direction of the slide plate 61 is offset in the top direction with respect to the planar part 111a of the base plate 111, and lies on a plane parallel to the planar part 111a.

A part of the plate member located on the outer side of the planar part 61a along the width direction may be formed to project towards the front direction by approximately two times the length of the planner part 61a. This part of the plate member located on the outer side of the planar part 61a may once be bent vertically in the bottom direction, and then be bent towards the inner side along the width direction to be parallel to the planar part 61a, in order to form a guide holder 61b to hold the guide 7. A part of the planar part 61a located on the inner side than the guide holder 61b along the width direction may be formed in a tongue shape by punching, then bent in the bottom direction, and further bent again towards the inner side along the width direction, in order to form a spring front holder 61e.

The guide 7 engages the guide holder 61b, and may be bonded by a suitable means such as insert molding and the like. In this second embodiment, the pair of left and right guides 7 also slideably support the pair of left and right rails 3c and 4c of the sub slide plates 3 and 4.

A rear stopper 61c that projects towards the bottom direction is formed on the rear side on both side parts of the slide plate 61 along the width direction. A front stopper 61d that projects towards the inner side along the width direction is formed on the end parts along the front direction on the bottom direction side of the guide holder 61b. An ear part 111c that projects towards the inner side along the width direction is formed on the end parts on the front direction side of the base plate 111.

The slide unit D2 for the electronic apparatus described above may be assembled in the manner described in the following. First, the two shafts 21 are inserted into the two inserting openings 22a in the shaft guide 22. Thereafter, the end parts of the two left shafts 21 in the front and rear directions are fitted into the pair of openings 3a a in the shaft holder 3a in the front and rear directions of the sub slide plate 3, and the end parts of the two right shafts 21 in the front and rear directions are fitted into the pair of openings 4a a in the shaft holder 4a in the front and rear directions of the sub slide plate 4.

The pair of left and right guides 7 are mounted on the pair of left and right guide holders 61b of the slide plate 61, respectively. In addition, the left rail 3c is inserted into the groove part of the left guide 7, and the right rail 4c is inserted into the groove part of the right guide 7. Thereafter, the shaft guide 22 is mounted on each of the pair of left and right shaft guide holders 111b of the base plate 111.

One end of each of the springs 8 and 9 engages a hole 111d located on the center side of the planar part 111a of the base plate 111 along the width direction, and the other end of each of the springs 8 and 9 engages a hole 61f formed in the spring front holder 61e of the slide plate 61. The slide unit D2 for the electronic apparatus in this second embodiment may be formed in this manner.

A screw that is not illustrated is inserted through a hole 111e formed at the four corners at the front, rear, left and right, in the planar part 111a and the ear part 111c of the base plate 111, and is screwed into a threaded part that is not illustrated and is formed in the main part 11 of the electronic apparatus S illustrated in FIGS. 2 through 5, to thereby fix the base plate 111 to the main part 11. A screw that is not illustrated is inserted through a hole 61g formed at the four corners at the front, rear, left and right, in the slide plate 61, and is screwed into a threaded part that is not illustrated and is formed in the sub part 12 of the electronic apparatus S illustrated in FIGS. 2 through 5, to thereby fix the slide plate 61 to the sub part 12.

The general slide operation and the functions obtained when making the transition between the closed state and the open state in the slid unit D2 for the electronic apparatus of this second embodiment may be the same as those of the slide unit D1 for the electronic apparatus in the first embodiment, and thus, a description thereof will be omitted.

With regard to the shaft 21 and the shaft guide 22 of this second embodiment, these constituent elements are designated by reference numerals different from the shaft 51 and the shaft guide 52 of the first embodiment in order to indicate that the constituent elements belong to the first slider mechanism 2, however, common parts may be used for the shafts 21 and 51 and the shaft guides 22 and 52.

The present invention is described in detailed by referring to the above embodiments, however, the present invention is not limited to these embodiments, and various modifications and substitutions may be made to the embodiments without departing from the scope of the present invention.

This application is based upon and claims the benefit of priority of a Japanese Patent Application No. 2010-157780 filed on Jul. 12, 2010, and the entire contents of the Japanese Patent Application No. 2010-157780 are incorporated herein by reference.

The invention claimed is:

1. A slide unit for an electronic apparatus, comprising:
a base having a flat surface extending in front and rear directions and having a left end part and a right end part along the front and rear directions on both sides along a width direction perpendicular to top and bottom directions of the flat surface;
a pair of left and right intermediate plates attached to the left end part and the right end part, respectively, to be slidable in the front and rear directions via a first slider mechanism; and
a slide plate attached to the pair of left and right intermediate plates to be slidable in the front and rear directions via a second slider mechanism different from the first slider mechanism,
wherein the second slider mechanism includes
a slide member, arranged on each of the pair of left and right intermediate plates, and extending in the front and rear directions; and
a pair of left and right sliding members, respectively provided on left and right sides of the slide plate, and respectively slidably supporting the slide member from both sides of the top and bottom directions and from both sides of the width direction,
wherein the left and right intermediate plates cover the pair of left and right sliding members.

2. The slide unit as claimed in claim 1, wherein the pair of left and right sliding members includes an inner peripheral surface making contact with an outer peripheral surface of the slide member that extends in a peripheral direction of the front and rear directions, for an entire region along the peripheral direction.

3. A slide unit for an electronic apparatus, comprising:
a base having a flat surface extending in front and rear directions and having a left end part and a right end part along the front and rear directions on both sides along a width direction perpendicular to top and bottom directions of the flat surface;
a pair of left and right intermediate plates attached to the left end part and the right end part, respectively, to be slidable in the front and rear directions via a first slider mechanism; and a slide plate attached to the pair of left and right intermediate plates to be slidable in the front and rear directions via a second slider mechanism different from the first slider mechanism, wherein at least one of the first slider mechanism and the second slider mechanism includes a slide member extending in the front and rear directions; and a sliding member slidably supporting the slide member from both sides of the top and bottom directions and from both sides of the width direction, and wherein the pair of left and right intermediate plates includes fixing parts to fix both end parts of the slide member in the front and rear directions.

4. The slide unit as claimed in claim 1, wherein the slide member has a cylindrical column shape, and the pair of left and right sliding members includes an inserting opening to which the slide member is inserted.

5. The slide unit as claimed in claim 3, wherein a plurality of slide members are provided with respect to one sliding member.

6. The slide unit as claimed in claim 5, wherein the plurality of slide members are arranged side by side along the width direction.

7. The slide unit as claimed in claim 1, wherein the slide plate is slidable in the front and rear directions relative to the left and right intermediate plates via the second slider mechanism, and wherein the left and right intermediate plates are slidable in the front and rear directions relative to the left and right end parts of the base.

8. The slide unit as claimed in claim 1, wherein the pair of left and right intermediate plates includes fixing parts to fix both end parts of the slide member in the front and rear directions.

9. A slide unit for an electronic apparatus, comprising:

a base having a flat surface extending in front and rear directions and having a left end part and a right end part along the front and rear directions on both sides along a width direction perpendicular to top and bottom directions of the flat surface;

a pair of left and right intermediate plates attached to the left end part and the right end part, respectively, to be slidable in the front and rear directions via a first slider mechanism; and a slide plate attached to the pair of left and right intermediate plates to be slidable in the front and rear directions via a second slider mechanism different from the first slider mechanism, wherein the first slider mechanism includes a slide member, arranged on the pair of left and right intermediate plates, extending in the front and rear directions; and a pair of left and right sliding members, respectively provided on left and right sides of the base, and slidably supporting the slide member from both sides of the top and bottom directions and from both sides of the width direction, wherein the left and right intermediate plates cover the pair of left and right sliding members.

10. The slide unit as claimed in claim 9, wherein the pair of left and right sliding members includes an inner peripheral surface making contact with an outer peripheral surface of the slide member that extends in a peripheral direction of the front and rear directions, for an entire region along the peripheral direction.

11. The slide unit as claimed in claim 9, wherein the pair of left and right intermediate plates includes fixing parts to fix both end parts of the slide member in the front and rear directions.

12. The slide unit as claimed in claim 9, wherein the slide member has a cylindrical column shape, and the pair of left and right sliding members includes an inserting opening to which the slide member is inserted.

13. The slide unit as claimed in claim 9, wherein the pair of left and right sliding members is arranged side by side along the width direction.

14. The slide unit as claimed in claim 9, wherein the slide plate is slidable in the front and rear directions relative to the left and right intermediate plates via the second slider mechanism, and wherein the left and right intermediate plates are slidable in the front and rear directions relative to the left and right end parts of the base.

\* \* \* \* \*